(12) United States Patent
Ho

(10) Patent No.: US 9,966,910 B2
(45) Date of Patent: May 8, 2018

(54) POWER CONTROL METHOD OF AMPLIFYING MODULE

(71) Applicant: AIROHA TECHNOLOGY CORP., Hsinchu (TW)

(72) Inventor: Chun-Hung Ho, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days. days.

(21) Appl. No.: 15/045,430

(22) Filed: Feb. 17, 2016

(65) Prior Publication Data

US 2016/0344357 A1    Nov. 24, 2016

Related U.S. Application Data

(60) Provisional application No. 62/165,352, filed on May 22, 2015.

(51) Int. Cl.
| | |
|---|---|
| *H03G 3/10* | (2006.01) |
| *H03F 3/19* | (2006.01) |
| *H03F 1/02* | (2006.01) |
| *H03F 1/30* | (2006.01) |

(52) U.S. Cl.
CPC ............. *H03F 3/19* (2013.01); *H03F 1/0222* (2013.01); *H03F 1/0266* (2013.01); *H03F 1/0261* (2013.01); *H03F 1/301* (2013.01); *H03F 1/302* (2013.01); *H03F 2200/18* (2013.01); *H03F 2200/451* (2013.01)

(58) Field of Classification Search
CPC ........ H03G 3/004; H03G 3/3042; H03G 3/30; H03F 1/0222; H03F 3/19; H03F 2200/451; H03F 1/0266; H03F 1/302; H03F 1/30; H03F 1/0261; H03F 2200/18; H03F 3/04; H03F 1/301

USPC .................................................. 330/285, 296
See application file for complete search history.

(56) References Cited

U.S. PATENT DOCUMENTS

| | | | | |
|---|---|---|---|---|
| 6,492,875 B2 * | 12/2002 | Luo | .......... | H03F 1/302 330/285 |
| 6,753,734 B2 * | 6/2004 | Arell | ........ | G05F 3/265 330/288 |
| 7,728,662 B2 * | 6/2010 | Apel | ..................... | H03F 1/0244 330/124 D |
| 8,525,590 B2 * | 9/2013 | Joly | ........ | H03F 1/0211 330/285 |
| 8,854,142 B2 * | 10/2014 | Iizuka | ........ | H03F 1/30 330/285 |
| 8,874,053 B2 * | 10/2014 | Liu | ........ | H03G 3/3042 330/129 |
| 9,065,389 B2 * | 6/2015 | Ding | ........ | H03F 1/302 |

(Continued)

FOREIGN PATENT DOCUMENTS

TW    201445872 A    12/2014

*Primary Examiner* — Khanh V Nguyen
(74) *Attorney, Agent, or Firm* — Rosenberg, Klein & Lee

(57) ABSTRACT

The present invention relates to a power control method of an amplifying module. The amplifying module comprises a control device and an amplifying device, wherein the control device is electrically connected to the amplifying device and provides a bias current and a supply voltage to the amplifying device. Further, the control device is able to adjust the supply voltage, the bias current or the bias voltage provided to the amplifying device according to the power mode of the amplifying device.

9 Claims, 5 Drawing Sheets

(56) References Cited

U.S. PATENT DOCUMENTS

| | | | |
|---|---|---|---|
| 9,337,787 B2* | 5/2016 | Schooley | H03F 3/21 |
| 2014/0094129 A1* | 4/2014 | Chang | H03F 3/19 |
| | | | 455/73 |
| 2014/0167861 A1* | 6/2014 | Song | H03F 3/245 |
| | | | 330/296 |

* cited by examiner

POWER CONTROL METHOD OF AMPLIFYING MODULE

REFERENCE TO RELATED APPLICATIONS

This application is based on Provisional application Ser. No. 62/165,352, filed May 22, 2015, currently pending.

FIELD OF THE INVENTION

The present invention relates to a power control method of an amplifying module. The power control method comprises the step of: adjusting or determining a supply voltage provided to an amplifying device according to the power mode of the amplifying device.

BACKGROUND

FIG. 1 is a block diagram of a common amplifying module. The amplifying module 10 comprises a first amplifying block 11 and a second amplifying block 13, and the gain of the first amplifying block 11 is different from the second amplifying block 13.

The first amplifying block 11 comprises a first input end 111, a first output end 113 and an amplifying unit 115 located between the first input end 111 and the first output end 113. The second amplifying block 13 comprises a second input end 131, a second output end 133 and a plurality of amplifying units 135 located between the second input end 131 and the second output end 133.

The gain of the second amplifying block 13 is larger than the first amplifying block 11. When an input signal is transmitted from the first input end 111 to the first output end 113, the amplifying unit 115 of the first amplifying block 11 will amplify the input signal to low power level.

Otherwise, when the input signal is transmitted from the second input end 131 to the second output end 133, the amplifying unit 135 of the second amplifying block 13 will amplify the input signal to high power level.

The amplifying module 10 may have several kinds of gains by selecting the first amplifying block 11 or the second amplifying block 13 to amplify the input signal. However, the amplifying module 10 have a plurality of amplifying blocks 11/13 and amplifying units 115/135, and thus the area and the production costs of the amplifying module 10 may be increased.

SUMMARY

It is one object of the present invention to provide a power control method of an amplifying module. The amplifying module comprises an amplifying device and a control device. The control device is able to adjust the supply voltage (Vcc) provided to the amplifying device dynamically according to the power mode of the amplifying device to improve energy consumption and linearity of gain of the amplifying device operated in the mid-power mode and/or the low power mode, and improve amplification efficiency of the amplifying device operated in the high power mode.

It is one object of the present invention to provide a power control method of an amplifying module. The amplifying module comprises an amplifying device and a control device. The control device is able to adjust the supply voltage (Vcc), the bias current (Ibias) and/or the bias voltage (Vbias) provided to the amplifying device according to the power levels of the input signal. Thus, performance of the amplifying device for several power levels of input signal is able to be improved.

For achieving above objects, the present invention provides a power control method of an amplifying module, the amplifying module comprising a control device and an amplifying device, wherein the amplifying device comprises a plurality of power modes and the control device is electronically connected to the amplifying device for providing a supply voltage to the amplifying device, and comprising steps of: selecting one of the power modes of the amplifying device; and adjusting or determining the supply voltage provided by the control device to the amplifying device according to the power mode.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which.

DETAILED DESCRIPTION OF THE PREFERRED EMBODIMENTS

Figure 2:
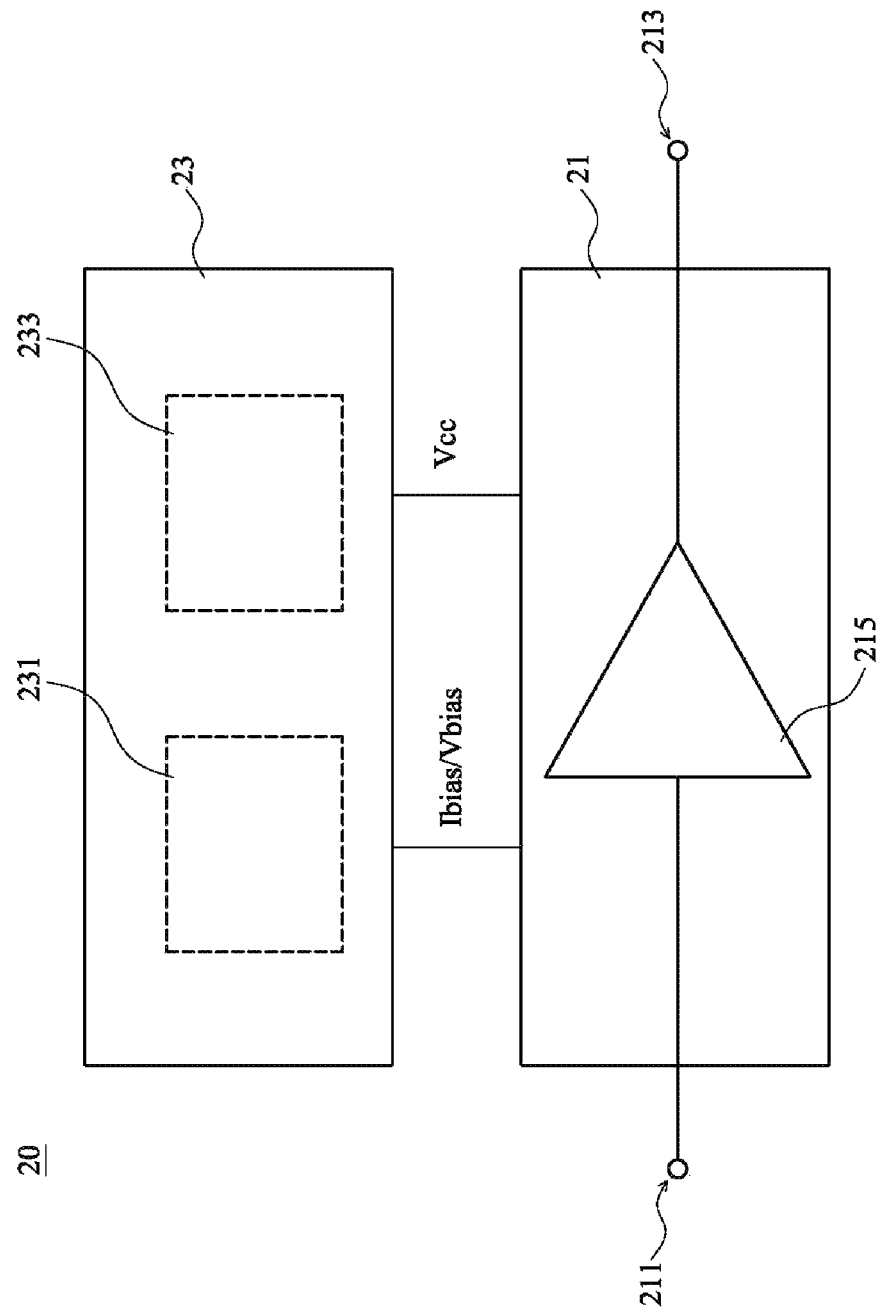
FIG. 2 is a block diagram of an amplifying module according to an embodiment of the present invention.
Figure 3:
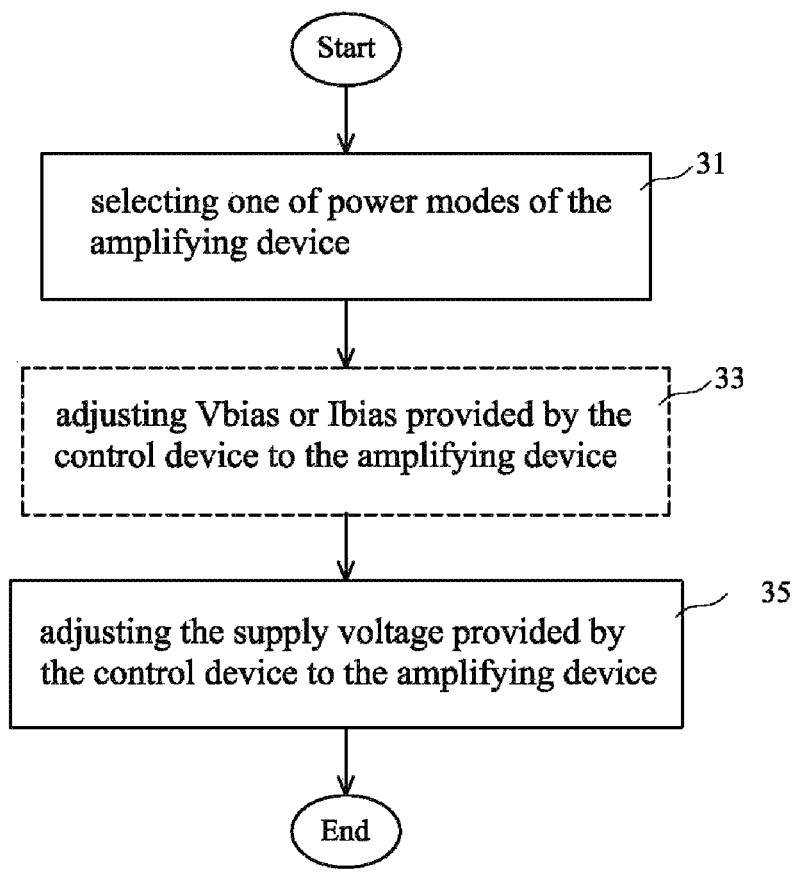
FIG. 3 is a flow chart of a power control method of the amplifying module according to an embodiment of the present invention.

FIG. 2 is a block diagram of an amplifying module according to an embodiment of the invention. FIG. 3 is a flow chart of a power control method of the amplifying module according to an embodiment of the present invention. The amplifying module 20 comprises an amplifying device 21 and a control device 23, and the control device 23 is electronically connected to the amplifying device 21 for providing a supply voltage Vcc, a bias current Ibias and/or a bias voltage Vbias to the amplifying device 21. Thus, the control device 23 is able to adjust or select gain or power mode of the amplifying device 21.

The amplifying device 21 may comprise a plurality of power modes, such as a high power mode, a mid-power mode and/or a low power mode, and the amplifying device 21 is able to select one of those power modes. Please referring to FIG. 3, the amplifying device 21 is able to select one of power modes according to request of the input signal or the RF signal, as the step 31.

The amplifying device 21 comprises at least one input end 211, at least one amplifying unit 215 and at least one output end 213, and the amplifying unit 215 is connected between the input end 211 and the output end 213. The amplifying unit 215 is able to amplify the input signal that is transmitted from the input end 211 to the output end 213. The amplifying device 21 is able to be operated in the high power mode to amplify the input signal to high power level. Further, the amplifying device 21 is able to be operated in the low power mode or the mid-power mode to amplify the input signal to low power level.

In generally, the control device 23 is able to adjust the bias current Ibias or the bias voltage Vbias provided to the amplifying device 21 according to the power mode selected or switched by the amplifying device 21, as the step 33. In a particular embodiment, the control device 23 may provide a high bias current Ibias or a high bias voltage Vbias to the amplifying device 21, and the amplifying device 21 is able to be selected or switched to the high power mode. Otherwise, the control device 23 may provide a low bias current Ibias or a low bias voltage Vbias to the amplifying device 21, and the amplifying device 21 is able to be selected or switched to the mid-power mode or the low power mode. It is one embodiment of the invention to select or switch power mode of the amplifying device 21 by adjusting the bias current Ibias or the bias voltage Vbias, but it is not limitation of the invention.

In above descriptions, the control device 23 is able to switch or select the power mode of the amplifying device 21 by adjusting the bias current Ibias or the bias voltage Vbias. However, above control method of the amplifying device 21 may cause following problems.

Firstly, when the amplifying device 21 is switched to the mid-power mode or the low power mode, the control device 23 still provides same supply voltage Vcc to the amplifying device 21. Thus, energy consumption of the amplifying device 21 operated in the mid-power mode or the low power mode may not be improved efficiently. Secondly, when the amplifying device 21 is switched to the high power mode, the control device 23 still provides same supply voltage Vcc to the amplifying device 21. Thus, amplification efficiency of the amplifying device 21 operated in the high power mode may not be improved.

For solving above problems, the control device 23 may adjust the supply voltage Vcc provided to the amplifying device 21 according to the power mode of the amplifying device 21, as the step 35. Thus, AM to AM distortion, AM to PM distortion, current consumption and/or voltage consumption of the amplifying device 21 can be improved efficiently.

In particular embodiment, when the amplifying device 21 is operated in the mid-power mode and/or the low power mode, the control device 23 may reduce the supply voltage Vcc provided to the amplifying device 21 to improve energy consumption and linearity of gain of the amplifying device 21 operated in the mid-power mode and/or the low power mode.

Otherwise, when the amplifying device 21 is operated in the high power mode, the control device 23 may increase the supply voltage Vcc provided to the amplifying device 21 to improve amplification efficiency of the amplifying device 21 operated in the high power mode.

Figure 1:
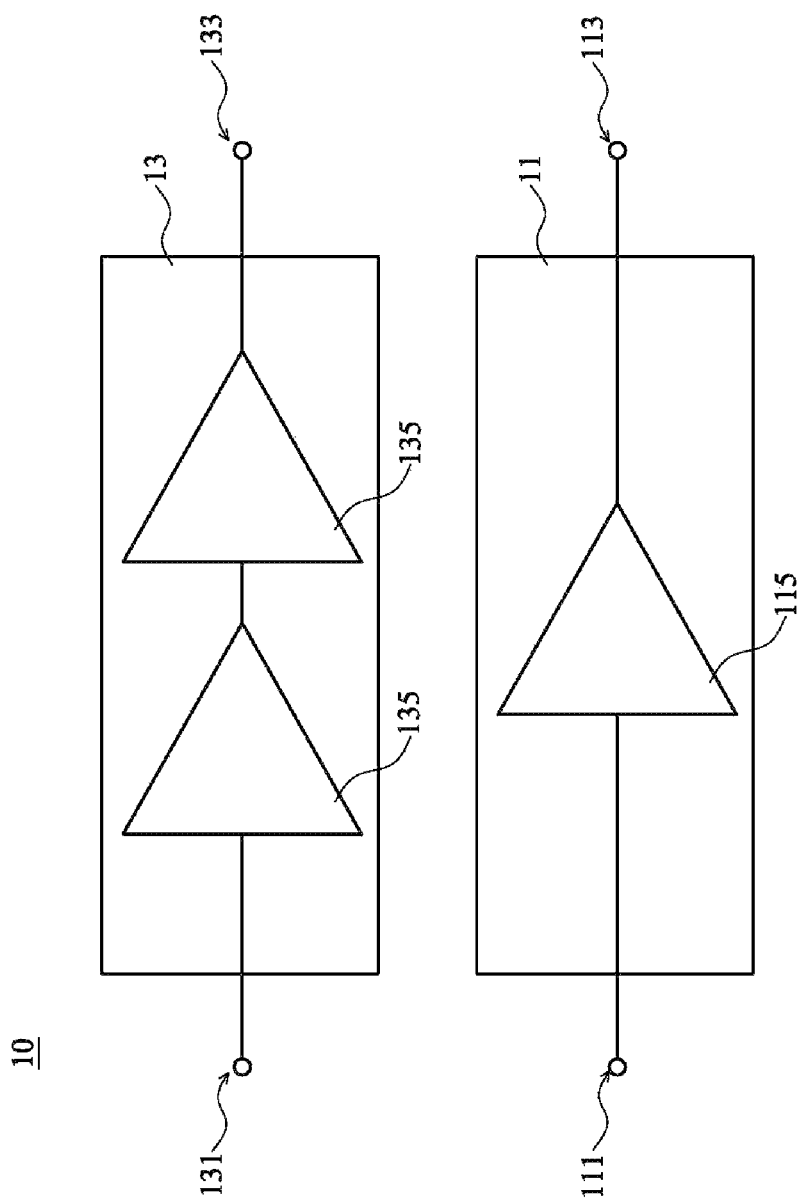
FIG. 1 is a block diagram of a common amplifying module.

Compared to the prior art in FIG. 1, the amplifying module 20 of the invention only comprises one amplifying device 21, and the power mode of the amplifying device 21 can be selected or switched by the control device 23. Thus, number of the amplifying device 21, area and production costs of the amplifying module 20 can be reduced. Further, the control device 23 or the bias controller 231 may adjust the supply voltage Vcc provided to the amplifying device 21 linearly or digitally.

In one embodiment of the invention, the control device 23 comprises, but not limited to, a bias controller 231 and a supply voltage controller 233. The bias controller 233 is able to adjust the bias current Ibias or the bias voltage Vbias provided to the amplifying device 21, and the supply voltage controller 233 is able to adjust the supply voltage Vcc provided to the amplifying device 21. The bias controller 231 and the supply voltage controller 233 are one embodiment of the invention, and are not limitation of the invention. In other embodiment of the invention, the control device 23 may not comprise the bias controller 231 and the supply voltage controller 233.

Figure 4:
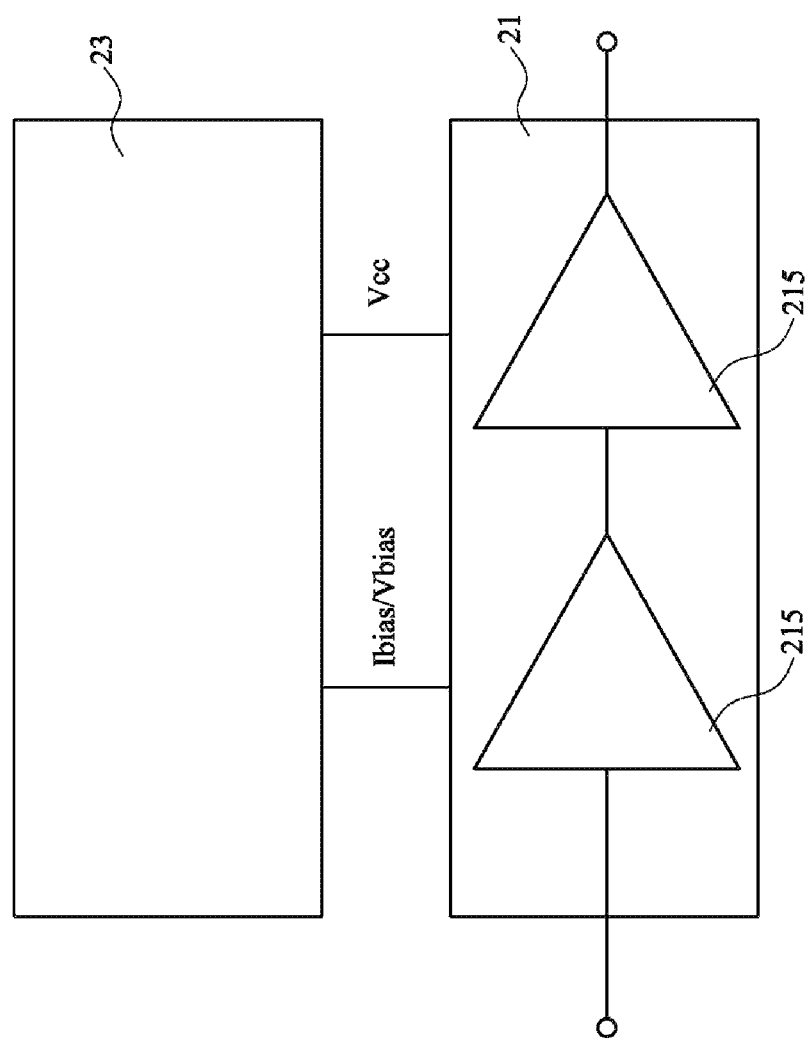
FIG. 4 is a block diagram of an amplifying module according to another embodiment of the present invention.

In one embodiment of the invention, the amplifying device 21 may comprise an amplifying unit 215, as shown in FIG. 2, or may comprise a plurality of amplifying units 215 in series, as shown in FIG. 4. The control device 23 is able to provide the supply voltage Vcc, the bias current Ibias and/or the bias voltage Vbias to each amplifying unit 215. Furthermore, the control device 23 is able to adjust or determine the supply voltage Vcc, the bias voltage Vbias and/or the bias current Ibias provided to each amplifying unit 215. For instance, the bias controller 231 is able to adjust or determine the bias current Ibias or the bias voltage Vbias provided to each amplifying unit 215, and the supply voltage controller 233 is able to adjust or determine the supply voltage Vcc provided to each amplifying unit 215.

Figure 5:
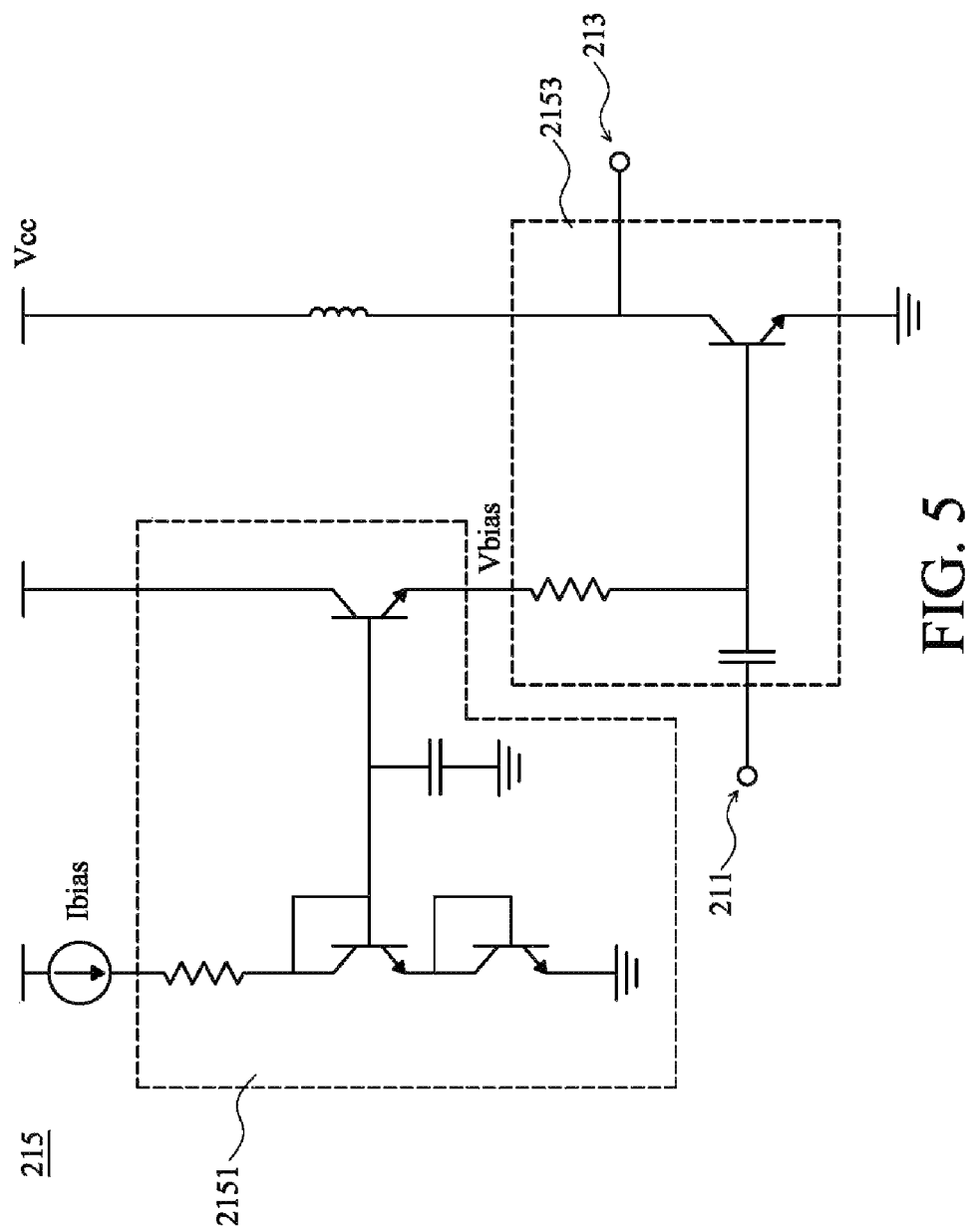
FIG. 5 is a circuit diagram of an amplifying unit of an amplifying module according to an embodiment of the present invention.

In one embodiment of the invention, the amplifying unit 215 comprises a bias unit 2151 and an amplifier 2153, as shown in FIG. 5. The input end 211 and the output end 213 of the amplifier 2153 correspond to the input end 211 and the output end 213 of the amplifying device 21 in FIG. 2. The amplifier 2153 is electronically connected to the bias unit 2151 and the supply voltage Vcc. The bias unit 2151 is able to adjust the bias voltage Vbias provided to the amplifier 2153.

The control device 23 is electronically connected to the amplifier 2153, and provides the supply voltage Vcc to the amplifier 2153. In particular embodiment, the control device 23 is able to adjust or determine the supply voltage Vcc provided to the amplifier 2153 according to the power mode of the amplifying device 21, the amplifying unit 215 and/or the amplifier 2153. Further, the control device 23 is able to adjust the bias current Ibias provided to the bias unit 2151 according to the power mode selected by the amplifier 2153 to adjust the bias voltage Vbias provided to the amplifier 2153 form the bias unit 2151.

In one embodiment of the invention, the bias unit 2151 may comprise a current mirror, and the amplifier 2153 may comprise a transistor. For instance, the current mirror of the bias unit 2151 may comprise a plurality of BJTs, and the transistor of the amplifier 2153 may be a BJT. BJT is one embodiment of the invention, and is not limitation of the invention. In other embodiment of the invention, the bias unit 2151 and the amplifier 2153 may consist of at least one MOSFET.

In above embodiment of the invention, the control device 23 is used to adjust the supply voltage Vcc provided to the amplifying device 21 according to the power mode of the amplifying device 21. In other embodiment of the invention, the amplifying module 20 may be used to amplify several types of RF signal, such 2G (second generation), 3G (third generation), 4G (fourth generation), WCDMA (Wideband Code Division Multiple Access), or LTE (telecommunication). Each type of RF signal may have different frequency, and the amplifying device 21 has to select or switch power mode or gain for each type of RF signal. Thus, the control device 23 is able to know the power mode that will be selected by the amplifying device 21 according to the frequency or types of the RF signal to adjust or determine the supply voltage Vcc, the bias current Ibias and/or the bias current provided to the amplifying device 21.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

What is claimed is:

1. A power control method of an amplifying module including a control device and an amplifying device, said amplifying device defining a plurality of power modes, said control device being electronically connected to said amplifying device for providing a supply voltage to said amplifying device and for applying an electrical bias to said amplifying device, the method comprising:
   selecting one of said power modes of said amplifying device;
   actuating said control device to selectively adjust said supply voltage and said electrical bias provided to said amplifying device responsive to said power mode;
   selecting a mid-power mode or a low power mode by said amplifying device; and
   reducing said supply voltage provided by said control device to said amplifying device.

2. The power control method of said amplifying module according to claim 1, wherein said amplifying device includes at least one amplifying unit, and said control device provides said supply voltage and a bias current to said amplifying unit.

3. The power control method of said amplifying module according to claim 2, wherein said amplifying unit includes a bias unit and an amplifier electronically connected to said bias unit and said control device, and said control device provides said supply voltage to said amplifier.

4. The power control method of said amplifying module according to claim 3, wherein said control device adjusts said supply voltage provided to said amplifier according to said power mode of said amplifying device, said amplifying unit, or said amplifier.

5. The power control method of said amplifying module according to claim 1, wherein said control device provides a bias voltage or a bias current to said amplifying device.

6. The power control method of said amplifying module according to claim 5, further comprising:
   adjusting said bias voltage or said bias current provided by said control device to said amplifying device responsive to a low-power mode, a mid-power mode, or a high-power mode of said amplifying device.

7. The power control method of said amplifying module according to claim 5, wherein said control device includes a bias controller and a supply voltage controller, said bias controller adjusts said bias voltage or said bias current provided to said amplifying device, and said supply voltage controller adjusts said supply voltage provided to said amplifying device.

8. A power control method of a amplifying module including a control device and an amplifying device, said amplifying device defining a plurality of power modes, said control device being electronically connected to said amplifying device for providing a supply voltage to said amplifying device and for applying an electrical bias to said amplifying device, the method comprising:
   selecting one of said power modes of said amplifying device;
   actuating said control device to selectively adjust said supply voltage and said electrical bias provided to said amplifying device responsive to said power mode;
   selecting a high power mode by said amplifying device; and
   increasing said supply voltage provided by said control device to said amplifying device.

9. A power control method of an amplifying module including a control device and an amplifying device, said amplifying device defining a plurality of power modes, said control device being electronically connected to said amplifying device for providing a supply voltage to said amplifying device and for applying an electrical bias to said amplifying device, the method comprising:
   selecting one of said power modes of said amplifying device;
   actuating said control device to selectively adjust said supply voltage and said electrical bias provided to said amplifying device responsive to said power mode;
   amplifying a RF signal by said amplifying device; and
   adjusting said supply voltage provided by said control device to said amplifying device according to frequency or types of said RF signal.

* * * * *